(12) United States Patent
Kakibayashi et al.

(10) Patent No.: US 6,875,984 B2
(45) Date of Patent: Apr. 5, 2005

(54) BIO ELECTRON MICROSCOPE AND OBSERVATION METHOD OF SPECIMEN

(75) Inventors: Hiroshi Kakibayashi, Nagareyama (JP); Shigeyuki Hosoki, Hachioji (JP); Yuji Takagi, Kamakura (JP); Ryo Miyake, Tsukuba (JP); Kuniyasu Nakamura, Musahino (JP); Mitsugu Sato, Hitachinaka (JP); Hiroyuki Kobayashi, Mito (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/621,444

(22) Filed: Jul. 18, 2003

(65) Prior Publication Data

US 2004/0135083 A1 Jul. 15, 2004

(30) Foreign Application Priority Data

Jan. 9, 2003 (JP) ........................................ 2003-002724

(51) Int. Cl.[7] .................................................. H01J 49/44
(52) U.S. Cl. ......................................... 250/311; 250/305
(58) Field of Search ................................. 250/311, 305, 250/310

(56) References Cited

U.S. PATENT DOCUMENTS 5,640,012 A * 6/1997 Krivanek .................... 250/305
6,140,645 A * 10/2000 Tsuno ......................... 250/311
6,563,112 B1 * 5/2003 Haking et al. .............. 250/305

* cited by examiner

Primary Examiner—Kiet T. Nguyen
(74) Attorney, Agent, or Firm—Antonelli, Terry, Stout & Kraus, LLP

(57) ABSTRACT

A bio electron microscope and an observation method which can observe a bio specimen by low damage and high contrast to perform high-accuracy image analysis, and conduct high-throughput specimen preparation. 1) A specimen is observed at an accelerating voltage 1.2 to 4.2 times a critical electron accelerating voltage possible to transmit a specimen obtained under predetermined conditions. 2) An electron energy filter of small and simplified construction is provided between the specimen and an electron detector for imaging by the electron beam in a specified energy region of the electron beams transmitting the specimen. 3) Similarity between an observed image such as virus or protein in the specimen and a reference image such as known virus or protein is subjected to quantitative analysis by image processing. 4) A preparation protocol of the bio specimen is made into a chip using an MEMS technique, which is then mounted on a specimen stage part of an electron microscope to conduct specimen introduction, preparation and transfer onto a specimen holder.

14 Claims, 9 Drawing Sheets

ELECTRON ACCELERATING VOLTAGE : 10kV

ELECTRON ACCELERATING VOLTAGE : 3kV

FIG. 7
(TABLE 2)

| SPECIMEN | CRITICAL ELECTRON ACCELERATING VOLTAGE POSSIBLE TO TRANSMIT A SPECIMEN (a) | OPTIMUM ACCELERATING VOLTAGE (b) | FACTOR m (b/a) |
|---|---|---|---|
| ARABIDOPSIS (100nm THICK) | 3.0kV | 7.5kV | 2.5 |
| MOUSE (100nm THICK) | 3.5kV | 9.0kV | 2.6 |
| MOUSE (300nm THICK) | 5.5kV | 14.0kV | 2.5 |

FIG. 8
(TABLE 3)

| SPECIMEN | STAINED SECTION | NEGATIVE STAINED SECTION | FROZEN SECTION |
|---|---|---|---|
| ELEMENTS | C(53%), O(23%), N(16%), H(7%), S(2%) | SAME AS IN THE LEFT OK | H(49.7%), O(24.9%), C(24.9%), N |
| STAINING ATOMS | Pb, U | W | NON (UNSTAINED) |
| AVERAGE ATOMIC NUMBER OF STAINING ATOMS | 87 | 74 | - |
| AVERAGE ATOMIC MASS OF STAINING ATOMS | 222.5 | 184 | - |
| DENSITY FLUCTUATION DEPENDING ON THE AREA | ±60% | ±30% | NON |
| RANGE OF FACTOR | 1.2 ~ 4.2 | 1.6 ~ 3.5 | 2.0 ~ 3.0 |

FIG. 9
(TABLE 4)

| ACCELERATING VOLTAGE | 3kV | 5kV | 10kV | 30kV |
|---|---|---|---|---|
| IMAGES | | | | |
| CONTRAST | 1 / 20 | 13 / 20 | 20 / 20 | 20 / 20 |
| RESOLUTION | 3 / 10 | 8 / 10 | 10 / 10 | 10 / 10 |

BIO ELECTRON MICROSCOPE AND OBSERVATION METHOD OF SPECIMEN

BACKGROUND OF THE INVENTION

1. Field of the Invention

The present invention relates to an electron microscope which can irradiate an electron beam onto a specimen and detects an electron transmitting the specimen or a secondary electron and a reflected electron emitted from the surface of the specimen to obtain a magnified image. More specifically, the present invention relates to a bio electron microscope.

2. Description of the Related Art

To observe, in particular, a bio specimen using an electron microscope, there are fine structure analysis of tissues, structure analysis of protein, and examination of virus. In recent years, various diseases including bovine spongiform encephalopathy (BSE), communicable disease such as HIV and HIC, food poisoning due to O157, and carbon fungus terrorism have been increased. Needs for high-reliability analysis and examination by a highly-magnified image observation using an electron microscope are on the increase. When noted virus and protein are fine to require high resolution and it is desired to observe their inner structures, a transmission electron microscope (TEM) performing imaging by an electron transmitting a specimen is used. A bio TEM is described in the H-7600 transmission electron microscope catalog No. HTD-040 (issued in November 2001) of Hitachi High-Technologies Corporation. It has an electron gun, an illumination system electron lens, a specimen holder and stage, an imaging system electron lens, a camera, an evacuation system, and a control system. Electron accelerating voltages for a bio TEM are mainly 100 kV and 120 kV, and may be used by lowering it to about 50 kV. A bio specimen observation procedure by the transmission electron microscope is described in "Electron Microscope", Vol. 37, No. 2, p. 81–84 (2002). In the examination of virus, a small round structured virus having a diameter of several tens of nm causing food poisoning is purified and concentrated from a fecal matter to observe an image magnified tens of thousands of times to hundreds of thousands of times, and then, the presence or absence of virus and the species of the virus are decided from its shape and the characteristic of its inner structure. In addition, in the structure analysis of protein, several magnified images of a protein specimen extracted and purified from a tissue are observed by tilting a specimen stage of the electron microscope, and then, the images are subjected to CT (computed tomography) processing to obtain a fine three-dimensional structure in the size of several tens of nm.

Bio specimens used for the transmission electron microscope are broadly divided into three: ① a stained section specimen, ② a negative stained specimen, and ③ a frozen section specimen. In the stained section specimen, the tissue of an animal or plant is cut into a section having a thickness of several tens of nm using a microtome equipped with a blade of diamond or glass, which is then placed on a meshed thin plate for electron microscope. To make the section, there are processes such as fixation, anhydration, embedding and cutting of the tissue. To obtain contrast corresponding to the tissue structure in an electron microscope image, staining the specimen is generally needed. As a stain, a reagent including heavy metal such as uranium acetate, lead citrate, lead hydroxide, or lead acetate is used. In general, the specimen is double-stained by uranium and lead. The reason why staining is needed is that since a main element constituting a living body are light elements such as hydrogen, oxygen, carbon and nitrogen, those scattering factors to an electron beam and its difference between the elements are small so that image contrast is very hard to provide. Stained is protein in the tissue. The higher the concentration of protein, the stronger protein is stained. As a result, contrast dependent on the concentration of protein is obtained in the electron microscope image.

In the ② (negative stained specimen, a tissue or fecal matter purified and concentrated using a reagent and a centrifugal machine is placed on a meshed thin plate for electron microscope. A particulate specimen such as virus is a representative example. As a stain, a phosphorate tungsten acid (PTA) liquid is generally used. In this method, in the case of virus, a bank of the stain is formed around the virus to form contrast between the bank and the virus. In the ③ frozen section specimen, a tissue is brought into contact with a copper block cooled by liquid helium or liquid nitrogen to be instantaneously frozen, and is then cut in a frozen state using a microtome equipped with a cooling stage. Observation of a tissue structure in an active state is aimed. Fixation and staining are not conducted, and a cryo-electron microscope equipped with a cooling specimen stage is used for observation. Since the specimen is not stained, the image contrast is very low.

In the recent transmission electron microscopes, a lens current, a shutter, and a specimen stage are controlled by a PC (personal computer) to facilitate operation such as focusing, photographing, and specimen slight movement. They have functions of automatic focus, automatic photographing, and automatic montage (obtaining a wide area image joined by automatically repeating specimen slight movement and photographing). The electron microscope is not equipped with functions of specimen preparation such as extraction, purification, concentration and staining to observe a specimen by the electron microscope, and of analyzing the species of virus and a protein three-dimensional structure from a photographed image.

The bio specimen observed by the transmission electron microscope is susceptible to damage by electron irradiation. A constituent constituting the tissue contains about 85% water. It also contains 10% protein, 2% adipo, 1.5% mineral, and 1.1% nucleic acid which are weak to electron irradiation. When an electron beam having an accelerating voltage of 100–120 keV is irradiated onto a specimen of a tissue of such structure, damage such as deformation, decomposition and destruction of the fine structure occurs. The stained section specimen and the negative stained specimen stained by heavy metal are rather stronger to electron irradiation than the frozen section specimen. The damage cannot be avoided as an essential problem. With the damage, the bio fine structure cannot be correctly analyzed and the accuracy of the examination is lowered. In particular, when a three-dimensional structure of a cell tissue is observed by TEM, the same area of the specimen is irradiated several tens of times while tilting the specimen. The electron dose is very large to make the damage significant. In this case, since the structure is gradually changed during photographing, the images at the respective tilt angles do not reflect the same structure. When image processing of the three-dimensional reconstruction is conducted using the images, artifact occurs without obtaining any correct three-dimensional structures.

In addition, unless the bio specimen is stained as described above, high contrast cannot be obtained. The fine structure may be changed by staining. It may not be understood that how the structure observed using the stained specimen corresponds to the original structure. These cause erroneous analysis and lowered examination accuracy.

The prior art electron microscope basically observes a magnified image of fine structure. Understanding the image, that is, extracting necessary information must be conducted by a user. A typical pathologic diagnosis by the electron microscope includes specification of viral disease. The species of virus is specified from the structure characteristic of a viral image observed by the electron microscope. For that, high knowledge and experience are needed. Only a limited number of scientists can conduct this.

The recent electron microscopes are equipped with image processing software. It can subject fast Fourier transformation to an image photographed by a CCD camera for frequency component analysis and conduct grain size analysis. It, however, is only placed supportably in order that the user can extract necessary information.

Further, in the preparation of the bio specimen, as described above, many processes such as fixation, anhydration, embedding, cutting and staining of the tissue are manually conducted for a long time. The respective processes must be optimum for each desired tissue structure for each specimen, requiring high technology, know-how and experience. Depending on variation in the preparation condition, quite different electron microscope images of the same tissue may also be obtained.

SUMMARY OF THE INVENTION

In view of the foregoing problems, an object of the present invention is to realize a bio electron microscope and an observation method which can observe a bio specimen by low damage and high contrast to perform high-accuracy image analysis, and conduct high-throughput specimen preparation.

The followings are listed as means for achieving the above object.

(1) To reduce damage to a bio specimen by electron irradiation, there is used an observation method at an accelerating voltage 1.2 to 4.2 times a critical electron accelerating voltage possible to transmit a specimen obtained under predetermined conditions. In particular, when using a scanning transmission electron microscope (STEM), there is no influence of chromatic aberration of an objective lens upon an image as compared with the prior art bio transmission electron microscope. Observation can be done at a lower accelerating voltage, which is advantageous. This permits observation at a low accelerating voltage below 1/10 of the accelerating voltage of 100 to 120 kV of the prior art bio electron microscope, reducing damage significantly. When a bio specimen preparation method is known, the stained section specimen is observed at an accelerating voltage 1.2 to 4.2 times the critical electron accelerating voltage possible to transmit a specimen, the negative stained specimen is observed at an accelerating voltage 1.6 to 3.5 times the same, and the frozen section specimen is observed at an accelerating voltage 2.0 to 3.0 times the same. The critical electron accelerating voltage possible to transmit a specimen is determined by a step of photographing an observation area or an approaching area of the specimen at a low accelerating voltage below 30 kV and a plurality of kinds of accelerating voltages, a step of comparing image qualities such as a resolution and contrast of the images, and a step of deciding the critical electron accelerating voltage possible to transmit a specimen. To arbitrarily set an accelerating voltage of an electron beam irradiated onto the specimen, an exciting current of electron lenses in illumination and imaging system or an electron beam apertures position which is optimum to the accelerating voltages is held as a recipe in a controlling computer for electron microscope.

(2) To observe the bio specimen at high contrast, an electron energy filter is provided between an electron detector detecting an electron beam transmitting a specimen and the specimen. The electron energy filter used herein is of a small size of about 10 mm square having an electrode for electrostatic deflection and an electrode for magnetic deflection and can be easily provided in the prior art scanning transmission electron microscope and scanning electron microscope (SEM). When an electron accelerating voltage is about 10 kV, a deflecting voltage below 1 kV and a deflecting current below 1A are applied to energy discriminate an electron beam transmitting the bio specimen. When the electron beam having an electron loss energy of about 250 eV is discriminated for imaging, the influence of carbon widely included in specimen embedding resin and the specimen can be removed to make the contrast of the image high.

(3) To extract information from an electron microscope image of the bio specimen, in particular, to specify the species of virus, image processing is used. An electron microscope image of virus whose species is known is a reference image. A virus image obtained by observing the specimen is an observed image. How much their fine structures are similar is quantitatively compared by the image processing. When they are similar within the specified condition, it is decided that the observed image has virus of the same species as that of the reference image. For the image processing, a correlation method and a pattern recognition method defining a frequency component as a characteristic parameter are used.

(4) For high-throughput and automation of the bio specimen preparation, micro equipment for specimen preparation having a micro chamber, a micro pump and a micro fluid channel executing preparation processing formed on a chip using the MEMS (Micro Electro Mechanical Systems) technique is mounted on the electron microscope. The micro equipment for specimen preparation is of a mechanism to be detachable from a specimen stage driving system part of the electron microscope. The micro equipment for specimen preparation executes a series of the specimen preparation step and a step of placing a prepared specimen on a meshed thin plate for electron microscope. Then, the specimen is placed on a specimen holder for electron microscope by a transfer mechanism for electron microscope to be moved to an electron microscope specimen chamber for observation.

BRIEF DESCRIPTION OF THE DRAWINGS

FIG. 7 shows Table 2;

FIG. 8 shows Table 3; and

FIG. 9 shows Table 4.

DETAILED DESCRIPTION OF THE PREFERRED EMBODIMENTS

An embodiment of the present invention will be described below.

Figure 1A:
FIG. 1(a) and FIG. 1(b) show electron microscope images of Arabidopsis photographed by an observation method of a bio specimen according to the present invention.
Figure 1B:
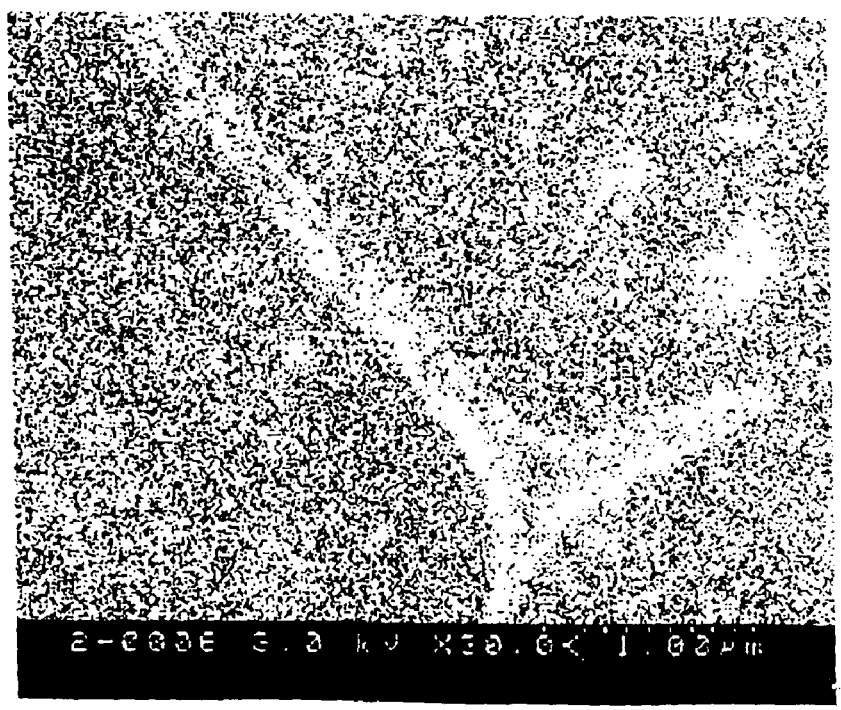

FIG. 1 shows scanning transmission electron microscope images (STEM images) observed using a bio electron microscope and an observation method according to the present invention. A specimen is a stained section specimen of Arabidopsis (plant) and has a specimen thickness of 100 nm. In FIG. 1(a), the specimen is observed by an incident electron beam having an optimum accelerating voltage of 10 kV, and in FIG. 1(b), the specimen is observed by an incident electron beam having a critical electron accelerating voltage possible to transmit a specimen of 3 kV (The definitions of the critical electron accelerating voltage possible to transmit a specimen and the optimum accelerating voltage are described later.). The former can obtain image qualities such as a resolution and contrast which are by no means inferior to the prior art bio transmission electron microscope (TEM) of a 100 kV accelerating voltage class. In other words, the energy of the incident electron beam is below 1/10 to significantly reduce damage to the specimen, and at the same time, the image qualities can be held high. This provides an observation method very effective for a bio specimen susceptible to damage by electron irradiation. The damage such as deformation, decomposition, and destruction of the bio fine structure which has been a problem in the prior art bio specimen can be reduced to below 1/10. Correct analysis of a fine structure and high-accuracy pathological examination can be conducted. On the other hand, in the latter (FIG. 1(b)), the resolution and contrast are both significantly deteriorated. This is caused by the fact that the energy of the incident electron beam is too low and hardly transmits the specimen.

Figure 6:
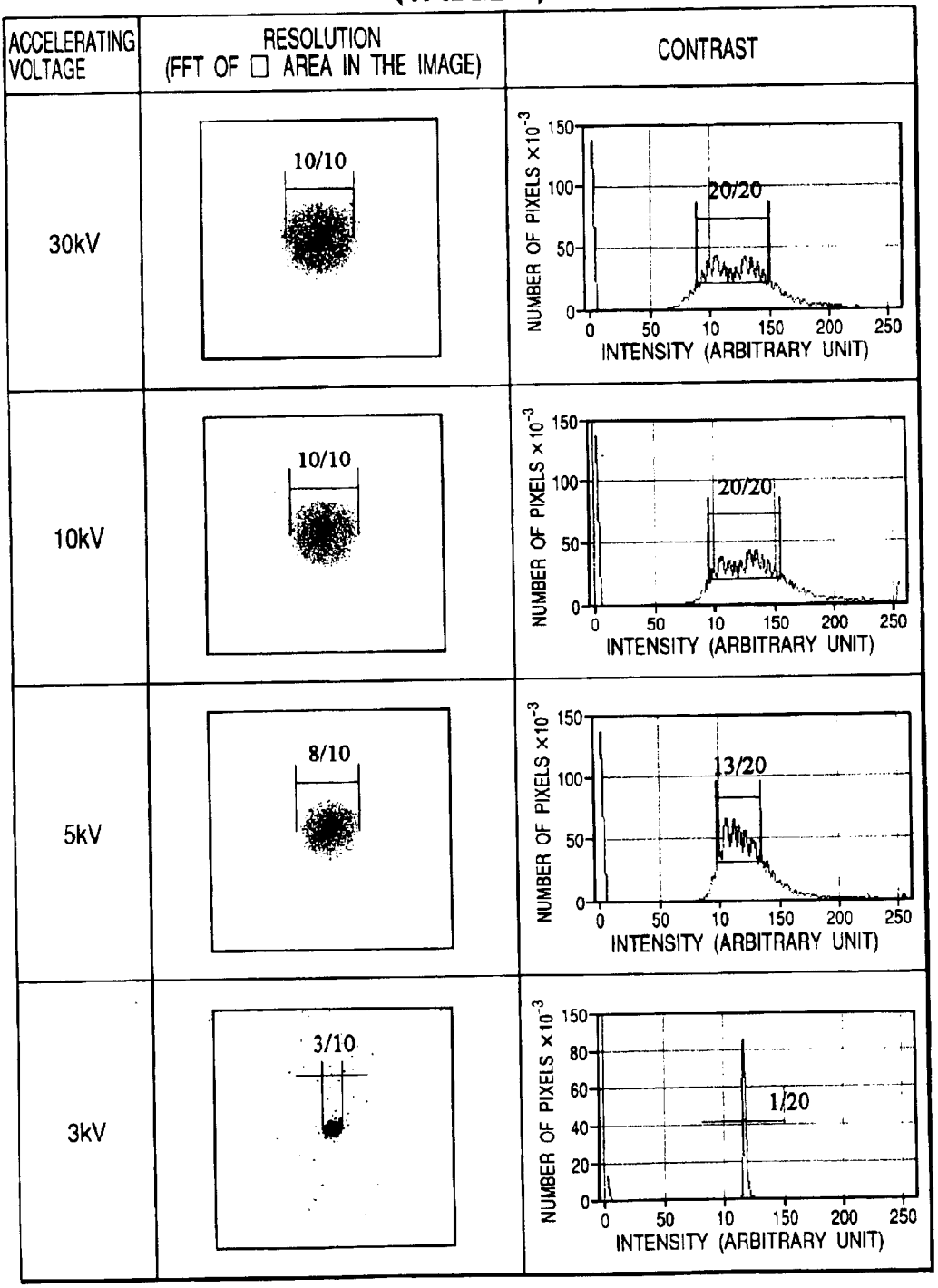
FIG. 6 shows Table 1.

In FIG. 6 (Table 1), the stained section specimen of Arabidopsis (plant) is observed at various electron accelerating voltages to summarize accelerating voltage dependence of the resolution and contrast. Data shown in the section of the resolution are fast Fourier transformation (FFT) images of the area indicated by □ (hollow square figure) in FIG. 1(a), and the diameter indicated by the arrow range is in proportion to a maximum spatial frequency, that is, an inverse number of the resolution. The larger the numerical value, the higher the resolution becomes. Data shown in the section of the contrast express distributions of the intensity (arbitrary unit) in each pixel forming the images as the number of pixels. The half maximum full-width of peak indicated by the arrow range corresponds to the contrast. The larger the numerical value, the images are formed at various intensities and the contrast is good. The critical electron accelerating voltage possible to transmit a specimen is defined as an accelerating voltage when the resolution is lowered to 3/10 or the contrast is lowered to 1/20 to an image observed at an accelerating voltage of 30 kV. The optimum accelerating voltage is defined as a minimum accelerating voltage which can obtain about the same resolution and contrast as those of the image observed at an accelerating voltage of 30 kV.

FIG. 7 (Table 2) shows, when bio specimens in which the kinds of tissues and the thickness of sections are different are observed, critical electron accelerating voltages possible to transmit a specimen, optimum accelerating voltages, and ratios between the optimum accelerating voltages and the critical electron accelerating voltages possible to transmit a specimen as factors m. It is found that the factors m are not dependent on the kind of the tissues and the thickness of the sections and have a fixed value of almost 2.5. The factors m are varied by the constituent of the bio specimen, the preparation method, and the observed area. The critical electron accelerating voltage possible to transmit a specimen is in proportion to the transmissivity of the electron beam to the bio specimen. The transmissivity is in proportion to penetration depth of the electron beam. A maximum penetration depth R is expressed by the formula of Kanaya and Okayama (K. Kanaya and S. Okayama; J. Phys. D: Appl. Phys. 5 (1972) 43):

$$R(cm) \approx 2.76 \times 10^{-11} A V^{5/3}/\rho Z^{8/9} \qquad \text{(Formula 1)}$$

where A: atomic mass, $\rho$: density, Z: atomic number, and V: electron accelerating voltage.

In FIG. 8 (Table 3), respective parameters of the specimen preparation method broadly divided into three kinds are summarized. The elements are hardly dependent on the kind of a tissue. The frozen section specimen in which a tissue is frozen as-is and cut is almost equal to the elements of the living body. The stained section specimen and the negative stained specimen subjected to the dehydration process and the displacement process are almost equal to the constitution of protein. The staining atoms of the stained section specimen are lead (element symbol Pb) and uranium (element symbol U). The staining atom of the negative stained specimen is tungsten (element symbol W). The frozen section specimen is unstained and has no staining atoms. The area of the stained section specimen observed by the electron microscope is decided by the fine structure noted by the user. The existence percentage (density) of the staining atoms is dependent on the concentration distribution of protein in the fine structure. Depending on which fine structure is included in the area, there may be density fluctuation of about ±60%. In the case of the negative stained specimen, a tissue is not directly stained and the bank of the stain is formed around virus. The existence percentage (density) fluctuation of the staining atoms is about ±30% of about ½ of the stained section specimen. The frozen section specimen has no staining atoms and has no fluctuation depending on the area. From the above, the ratio between maximum and minimum accelerating voltages giving the fixed maximum penetration depth R is obtained using Formula 1 to decide the range of the factor m in consideration of an experimental value error of ±20% from an experimental value of 2.5. The specimens of the preparation methods are decided as shown in the lowest stage of Table 3. When the specimen preparation method is known, selection of the optimum accelerating voltage suitable for this is enabled. When the specimen preparation method is not known, selection of the factor m of 1.2 to 4.2 can correspond to all the bio specimens.

FIG. 9 (Table 4) shows display screens in which the optimum accelerating voltages of bio specimen observation are decided by the above method. In this example, the critical electron accelerating voltage possible to transmit a specimen is 3 kV and the optimum accelerating voltage is 10 kV. The process to decide both is as follows. First, the bio specimen is introduced into a specimen chamber of the bio electron microscope to decide an area. Here, the area near the fine structure region noted is selected. Next, the electron accelerating voltage of 30 kV as an initial value is gradually lowered to photograph an electron microscope image, writing image data to an image analyzing computer. For the written image data, respective quantitative values of a resolution and contrast are sequentially obtained using fast Fourier transformation (FFT) and intensity distribution analysis software (The same data as that of Table 1 is obtained.). As compared with the data at an accelerating voltage of 30 kV, when the resolution is 3/10 and the contrast is 1/20, the image observation is stopped. The accelerating voltage at this time is the critical electron accelerating voltage possible to transmit a specimen. The factor m is selected in the range shown in Table 3 according to the bio specimen preparation method (Generally, the factor m=2.5 is selected.). The critical electron accelerating voltage possible to transmit a specimen is multiplied by m to obtain the optimum accelerating voltage. The area is moved to the noted fine structure region noted to observe the desired electron microscope image at the optimum accelerating voltage, which is then written. Very low damage observation can be achieved. When the specimen holder of a specimen cooling type is used, it is more effective.

Figure 2:
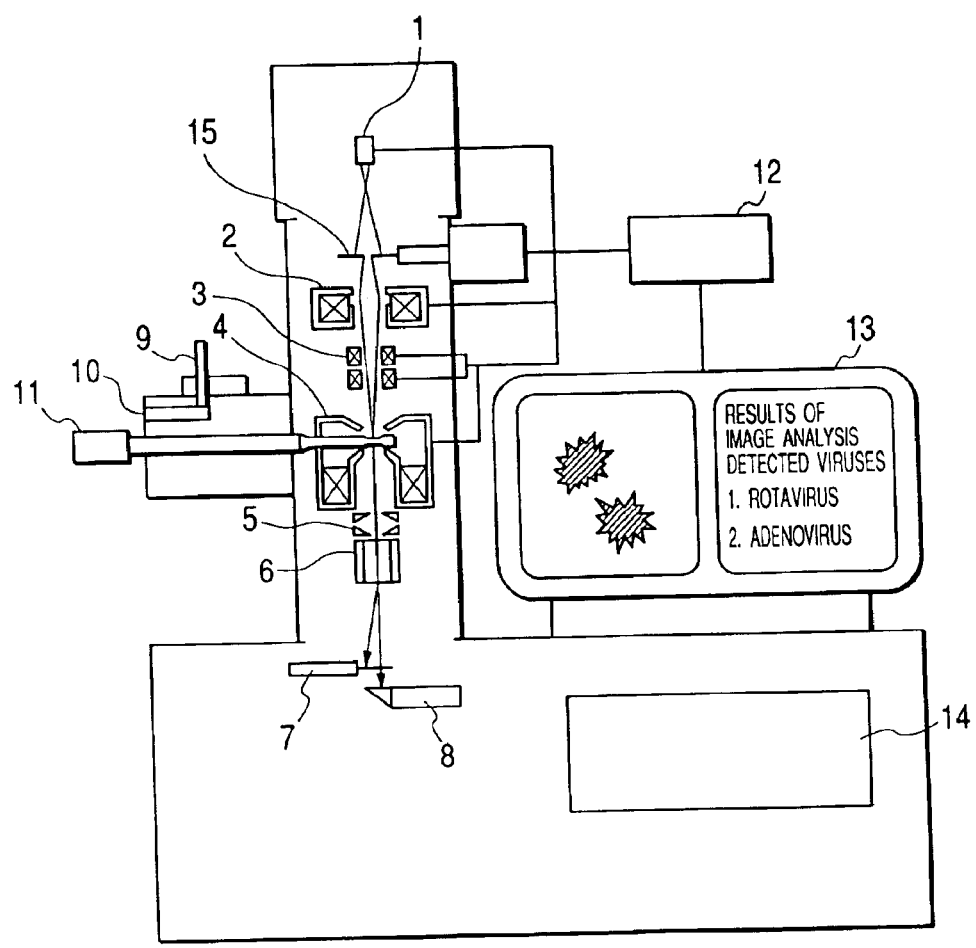
FIG. 2 is an overall block diagram of a bio electron microscope according to the present invention.

The above observation process can be automatically conducted using the bio electron microscope of the present invention. FIG. 2 shows an overall block diagram of the bio electron microscope of the present invention. It has an electron illumination system having an electron gun 1, a condenser lens 2, a scanning coil 3, an objective lens 4 and a condenser aperture driven with pulse motor 15, an imaging system having a beam alignment coil 5, an electron energy filter 6, an energy selection slit 7 and an electron detector 8, a meshed thin plate transfer for electron microscope 9, specimen preparation micro equipment 10, a specimen holder 11, a recipe server for arbitrary accelerating voltage 12, an image and analyzed data display screen 13, and an equipment controlling and image analyzing computer 14. The method for imaging an electron microscope image is the same as that of the prior art scanning transmission electron microscope (STEM).

When deciding the critical electron accelerating voltage possible to transmit a specimen and the optimum accelerating voltage, image observation is conducted while the accelerating voltage is gradually lowered. When the accelerating voltage is changed, the optimum conditions of the illumination system and the imaging system are also changed. In the present invention, the optimum conditions at an arbitrary accelerating voltage (emission current of the electron gun, the condenser apertures position, and exciting current in the respective lens) are stored into the recipe server for arbitrary accelerating voltage 12 to control the respective conditions to an optimum value according to the accelerating voltage at image observation. The accelerating voltage of 30 kV as an initial value can be automatically controlled in an arbitrary voltage step by the equipment controlling and image analyzing computer 14. The equipment controlling and image analyzing computer 14 and the recipe server for arbitrary accelerating voltage 12 are engaged with each other. The analysis software of the resolution and contrast can automatically execute the above observation process since the timing of input and analysis execution of image data formed by a signal from the electron detector 8 is controlled by a signal from the equipment controlling and image analyzing computer 14 and the recipe server for arbitrary accelerating voltage 12.

Figure 3A:
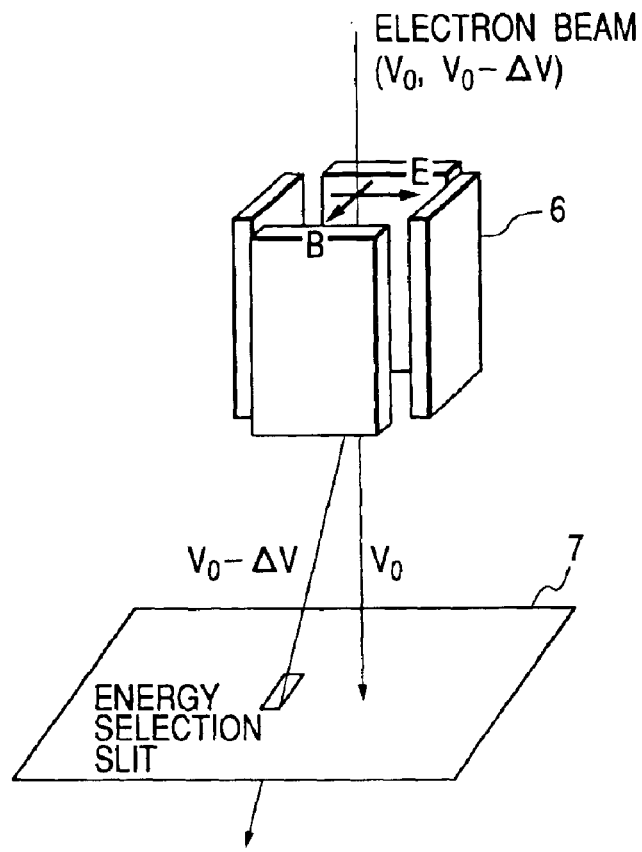
FIG. 3(a) and FIG. 3(b) are a block diagram of an electron energy filter and a specific example of energy selection, respectively.
Figure 3B:
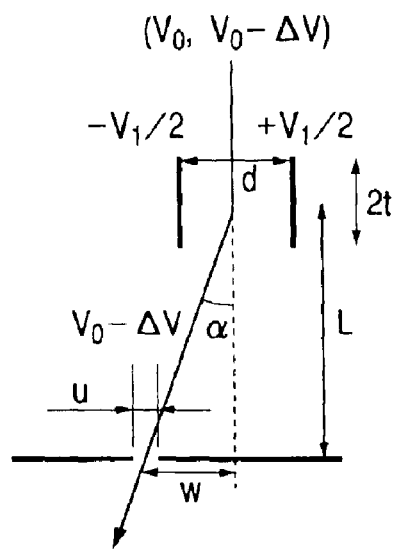

The electron energy filter 6 is used for high-contrast observation of the unstained specimen such as the frozen section specimen. FIG. 3(a) shows a block diagram of the electron energy filter. It is of a small size of about 10 mm square having an electrode for electrostatic deflection and an electrode for magnetic deflection. It deflects an electron beam transmitting the bio specimen according to an energy to obtain energy diffusion of the electron beam on the energy selection slit 7. When only the electron beam having a specific energy is transmitted by the energy selection slit 7, imaging can be conducted only by the electron beam of the energy. Using FIG. 3(b), a specific example of energy selection is shown. The energy of the electron beam transmitting the specimen is assumed to be a mixture of $V_0$ and $V_0-\Delta V$. At this time, the electron beam having an energy of $V_0-\Delta V$ is deflected only by an angle α. α is expressed by $$\alpha = tV_1\Delta V/2dV_0^2 \quad \text{(Formula 2)}$$

where t: ½ of the height of the electrode for electrostatic deflection, $V_1$: an applied voltage of the electrode for electrostatic deflection, d: a space between the electrodes for electrostatic deflection, $V_0$: an energy of an electron beam incident upon the specimen, and $\Delta V$: an energy lost in the specimen. A deflection amount W of the energy selection slit 7 is $$W = \alpha L \quad \text{(Formula 3)}$$

where L: a distance from the center of the electrode for electrostatic deflection to the energy selection slit 7. When t=5 mm, $V_1$=500V, d=8 mm, $V_0$=10 keV, $\Delta V$=250 eV, and L=185 mm, $\alpha = 3.91 \times 10^{-4}$ rad. and W=0.072 mm. A slit width u of 0.010 mm corresponds to an energy width of about 35 eV. A 250 eV energy distribution image can be obtained at the energy resolution of the value. In this case, the influence of carbon (C(280 eV)) widely included in specimen embedding resin and the specimen can be removed to make the contrast of the image higher. When Ca(350 eV), N(415 eV) and O(520 eV) are fetched into the slit, distribution images of the respective elements can be obtained. Not only the fine structure but also the elements can be analyzed.

Figure 4:
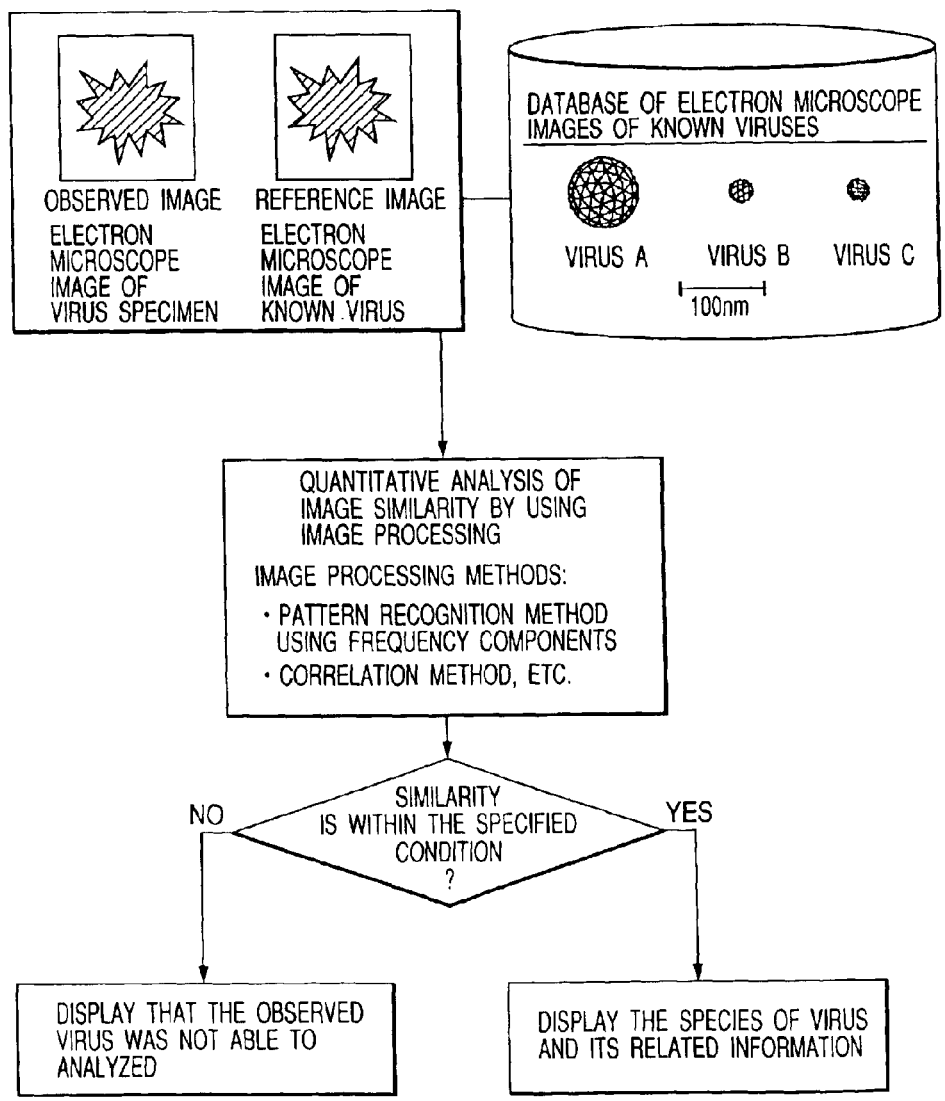
FIG. 4 is a flowchart of image processing specifying the species of virus.

The equipment controlling and image analyzing computer 14 is equipped with image analysis software identifying the species of virus and protein in a bio specimen. The analyzed result is displayed on the image and analyzed data display screen 13. FIG. 4 shows a flowchart of the image processing specifying the species of virus using the image analysis software. An image obtained by observing the specimen of virus is written as an observed image to the equipment controlling and image analyzing computer 14. The computer is equipped with a database of electron microscope images of viruses whose species are known. As shown in FIG. 4, various pathogenic viruses have a characteristic in their structures, and the sizes and structures are almost fixed between the same species of viruses. The database has representative images (reference images) of various viruses and its related information such as their properties and remedies. The image magnification and contrast of the observed image are adjusted so as to be compared with the reference image. Then, the similarity between the observed image and the reference image in the database is quantitatively analyzed by using image processing. As the image processing method, the pattern recognition method using frequency components and the correlation method are used. When the similarity is within the specified condition, the species of the observed virus and its related information are displayed. Otherwise, there is displayed that the virus was not able to be analyzed. This can automatically execute, at the observed place, identification of the species of virus which has needed high knowledge and experience so as to make the pathological diagnosis more efficient.

Figure 5:
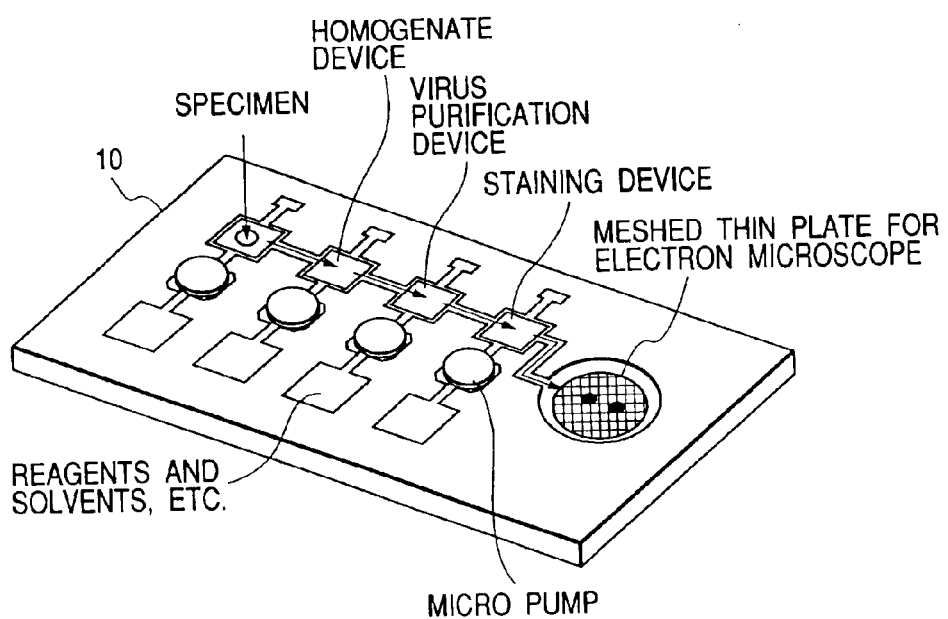
FIG. 5 is a block diagram of specimen preparation micro equipment.

The specimen preparation micro equipment 10 automatically executes the specimen preparation when a specimen of a very small amount of a tissue or fecal matter is injected. FIG. 5 shows the construction of the specimen preparation micro equipment. It is chip-like with a size of about several cm square and a thickness of several mm. It is of a mechanism so as to be detachable from the specimen stage driving system part of the bio electron microscope. On the chip are formed the micro chamber, micro pump and micro fluid channel executing the preparation process using the MEMS (Micro Electro Mechanical Systems) technique. The chip is provided on its back surface with an electrode to supply a driving power of the micro chamber, micro pump and micro fluid channel from the specimen stage driving system. FIG. 5 shows equipment of a type executing the specimen preparation for detecting virus from a fecal matter specimen. The preparation process is as follows. First, a fecal matter dissolved in water is injected into the uppermost stream micro chamber. It is then moved to the next process in the micro fluid channel. A homogenate device performs high-speed micro-centrifugation to separate the phase containing virus. A virus purification device further conducts ultra high-speed micro-centrifugation while injecting a reagent when needed, thereby removing noises. The purified virus specimen is moved to the meshed thin plate with supporting film for electron microscope. The micro pump is used to supply the negative stain from the staining device onto the meshed thin plate. It is air-dried. It can thus be observed by the electron microscope. The meshed thin plate is placed on the specimen holder 11 by the meshed thin plate transfer 9 for electron microscope. The meshed thin plate transfer 9 for electron microscope has at its front edge a pin detaching the meshed thin plate. The specimen holder 11 is moved to the electron microscope specimen chamber for observation. The above operation is controlled by the equipment controlling and image analyzing computer 14 and can be automatically executed. The present invention can automatically execute the specimen preparation which has been troublesome and has needed a skill to significantly improve the efficiency of the specimen preparation. The preparation condition can be fixed to bring the purified state and stained state between the specimens to the same level. As a result, the high accuracy of the examination and analysis can be achieved.

The effects of the embodiment of the present invention are as follows. The observation method of a bio specimen using the electron accelerating voltage 1.2 to 4.2 times the critical electron accelerating voltage possible to transmit a specimen can significantly reduce the electron beam irradiation damage (to $\frac{1}{10}$) as compared with the prior art and can observe the bio structure at high accuracy. With the electron energy filter, the unstained specimen by the small and low-cost equipment construction can be observed at high contrast. The method for image processing analyzing similarity between the observed image of the bio specimen and the reference image in the database can automatically execute, at the observed place, identification of the species of virus which has needed high knowledge and experience. The specimen preparation micro equipment which can be systematic in the electron microscope body can automatically execute the specimen preparation which has been troublesome and has needed a skill to significantly improve the efficiency of the specimen preparation. By making use of the above effects, high accuracy and high throughput can be achieved in the pathological examination and the bio fine structure analysis.

What is claimed is:

1. A bio electron microscope wherein in an electron microscope having an electron illumination system converging or collimating an accelerated elctron beam to irradiate it onto a specimen and an imaging system detecting an electron transmitting the specimen or a secondary electron and a reflected electron emitted from the surface of the specimen to obtain a magnified image, an electron energy filter is provided between an electron detector of the imaging system which detects an electron beam transmitting the specimen and the specimen, and wherein in an image analysis part and an image display part, an observed image of virus or protein included in the specimen and a reference image of known virus or protein are compared and subjected to quantitative analysis using image processing software, and the species of virus or protein or the species of a substance in the specimen is identified as a result of the comparison so as to display the result.

2. The bio electron microscope according to claim 1, wherein to set an accelerating voltage of an electron beam irradiated onto said specimen to a desired value, at least one of an emission current of an electron gun, an exciting current of electron lenses in illumination and imaging system and an electron beam apertures position which are optimum to the accelerating voltage is held as a recipe in a controlling computer.

3. A bio electron microscope wherein in an electron microscope having an electron illumination system converging or collimating an accelerated electron beam to irradiate it onto a specimen and an imaging system detecting an electron transmitting the specimen or a secondary electron and a reflected electron emitted from the surface of the specimen to obtain a magnified image, an electron energy filter is provided between an electron detector of the imaging system which detects an electron beam transmitting the specimen and the specimen, wherein chip-like specimen preparation equipment using an MEMS (Micro Electro Mechanical Systems) technique is mounted on a specimen stage part.

4. The bio electron microscope according to claim 3, wherein to set an accelerating voltage of an electron beam irradiated onto said specimen to a desired value, at least one of an emission current of an electron gun, an exciting current of electron lenses in illumination and imaging system and an electron beam apertures position which are optimum to the accelerating voltage is held as a recipe in a controlling computer.

5. An observation method utilizing a bio electron microscope, comprising the steps of:
   irradiating an accelerated electron beam to a specimen by an electron illumination system including at least an electron gun, a scanning coil, a plurality of lenses and an electron beam aperture;
   detecting at least one of a secondary electron, a reflected electron and a transmission electron generated by the irradiation of the electron beam to the specimen;
   obtaining an image in accordance with the detected electron; and
   controlling an accelerating voltage of the electron gun based on information of a recipe server storing at least one of recipes including a recipe of an emission current of the electron gun, a recipe of an exciting current of one of the plurality of lenses, and a recipe of a position of the electron beam aperture.

6. An observation method according to claim 5, wherein the step of irradiating includes utilizing different accelerating voltages for irradiating the accelerated electron beam to the specimen; and
   further comprising a step for determining a critical electron accelerating voltage by comparing an image obtained when the accelerating voltage of the electron beam is 30 kV and an image obtained when the accelerating voltage of the electron beam is under 30 kV;
   wherein the step for controlling utilizes controlling the accelerating voltage in a range of 1.2 to 2.4 times of a critical electron accelerating voltage;
   wherein the critical electron accelerating voltage is defined as a voltage in which at least one of a resolution power of the image is lowered to one third of a resolution power of the image obtained when an accelerating voltage is 30 kV and a contrast of the image is lowered to one twentieth of a contrast of the image obtained when an accelerating voltage is 30 kV.

7. An observation method according to claim 5, wherein the step of irradiating includes utilizing different accelerating voltages for irradiating the accelerated electron beam to the specimen;

further comprising a step for determining a critical electron accelerating voltage by comparing an image obtained when the accelerating voltage of the electron beam is 30 kV and an image obtained when the accelerating voltage of the electron beam is under 30 kV;

the step for controlling includes controlling the accelerating voltage to a minimum accelerating voltage;

wherein the minimum accelerating voltage is defined as a voltage in which substantially a same resolution power and contrast of an image is obtainable as a resolution power and contrast of an image obtained when the accelerating voltage is 30 kV.

8. An observation method according to claim 5, further comprising the steps of:

comparing an observed image and a reference image to quantitatively analyze a similarity between the observed image and the reference image; and identifying at least one of a species of virus, a species of protein and a species of a substance included in the specimen based on a result of the comparison.

9. An observation method according to claim 5, wherein chip-like specimen preparation equipment using an MEMS (Micro Electro Mechanical Systems) technique is mounted on a sample stage for holding the specimen.

10. A bio electron microscope comprising:

an electron illumination system including an electron gun, a scanning coil, a plurality of lenses and an electron beam aperture;

a specimen holder for mounting a specimen;

an imaging system for obtaining an image, including a detector for detecting at least one of secondary electron, a reflected electron and a transmission electron generated by irradiation of an electron beam to the specimen;

a recipe server for storing at least one of recipes including a recipe of an emission current of said electron gun, a recipe of an exciting current of one of the plurality of lenses and a recipe of a position of the electron beam aperture; and a controlling computer for controlling an accelerating voltage of the electron gun based on information stored in the recipe server.

11. A bio electron microscope according to claim 10, further comprising:

an image analyzing part that compares at least one of a resolution power of images and a contrast of images;

wherein the image analyzing part determines a critical electron accelerating voltage defined as at least one of a voltage in which a resolution power of the image is lowered to one third of resolution power of the image obtained when an accelerating voltage is 30 kV and a contrast of the image is lowered to one twentieth of a contrast of the image obtained when an accelerating voltage is 30 kV; and wherein the controlling computer controls the accelerating voltage in a range of 1.2 to 2.4 times of the critical electron accelerating voltage.

12. A bio electron microscope according to claim 10, further comprising:

an image analyzing part that compares at least one of a resolution power of images and a contrast of images;

wherein the image analyzing part determines a minimum accelerating voltage defined as a voltage in which substantially a same resolution power and contrast of an image is obtainable as a resolution power and contrast of an image obtained when the accelerating voltage is 30 kV; and wherein the controlling computer controls the accelerating voltage to the minimum accelerating voltage.

13. A bio electron microscope according to claim 10, wherein the controlling computer includes a comparator which compare an observed image and a reference image and identifies at least one of a species of a virus, a species of protein and a species of a substance included in the specimen as a result of the comparison.

14. A bio electron microscope according to claim 10, further comprising chip-like specimen preparation equipment using an MEMS (Micro Electron Mechanical Systems) technique.

* * * * *